United States Patent [19]

Maki et al.

[11] Patent Number: 4,873,688
[45] Date of Patent: Oct. 10, 1989

[54] HIGH-SPEED REAL-TIME REED-SOLOMON DECODER

[75] Inventors: Gary K. Maki; Kelly B. Cameron; Patrick A. Owsley, all of Moscow, Id.

[73] Assignee: Idaho Research Foundation, Moscow, Id.

[21] Appl. No.: 105,401

[22] Filed: Oct. 5, 1987

[51] Int. Cl.[4] ............................................. G06F 11/10
[52] U.S. Cl. ................................................... 371/37.1
[58] Field of Search ........................ 371/37, 38, 39, 40

[56] References Cited

U.S. PATENT DOCUMENTS

| | | | |
|---|---|---|---|
| 4,162,480 | 7/1979 | Berlekamp | 371/37 |
| 4,413,339 | 11/1983 | Riggle et al. | 371/38 |
| 4,434,487 | 2/1984 | Rubinson et al. | 371/10 |
| 4,564,945 | 1/1986 | Glover et al. | 371/38 |

OTHER PUBLICATIONS

Berlekamp, Algebraic Coding Theory, McGraw-Hill Book Co., 1968, pp. 21–30.
"VLSI Reed Solomon Decoder Design" by Gary K. Maki, Patrick A. Owsley, Kelley B, Cameron and Jack Venbrux, published in Communications-Computers: Teamed for the '90's, Conference Record vol. 3 of 3, 1986 IEEE Military Communications Conference.
"Error-Correction Coding for Digital Communications" by George C. Clark, Jr. and J. Bibb Cain, pp. 195–201, published by Plenum Press, New York, First Printing Jun. 1981.

Primary Examiner—Charles E. Atkinson
Attorney, Agent, or Firm—Limbach, Limbach & Sutton

[57] ABSTRACT

A Galois Field error correction decoder is described which can correct an error in a received polynomial. The apparatus includes means for generating a plurality of syndrome polynomials. A magnitude polynomial and a location polynomial having a first derivative are calculated from the syndrome polynomials utilizing Euclid's Algorithm. The module utilizing Euclid's Algorithm includes a general Galois Field multiplier having combinational logic circuits. The magnitude polynomial is divided by the first derivative of said location polynomial to form a quotient. Preferably the division includes finding the inverse of the first derivative and multiplying the inverse by the magnitude polynomial. The error is corrected by exclusive ORing the quotient with the received polynomial.

13 Claims, 12 Drawing Sheets

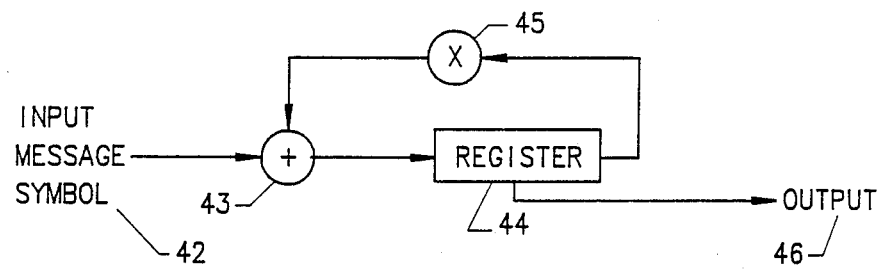
Fig. 2 (PRIOR ART)
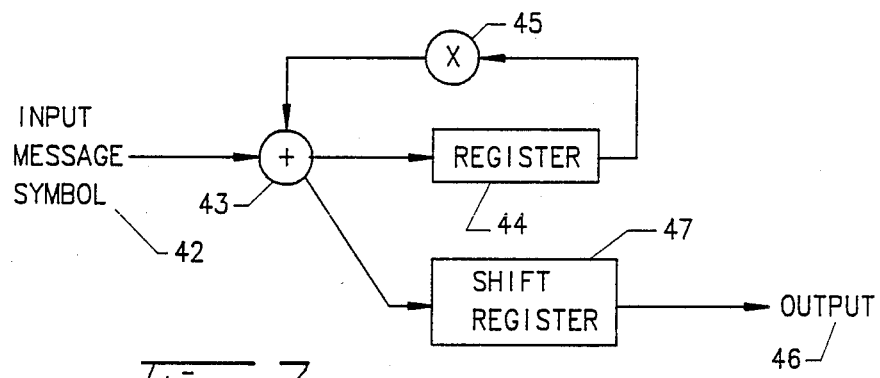
Fig. 7
| M(3,0) | M(2,0) | M(1,0) | M(0,0) |
|--------|--------|--------|--------|
| M(3,1) | M(2,1) | M(1,1) | M(0,1) |
| M(3,2) | M(2,2) | M(1,2) | M(0,2) |
| M(3,3) | M(2,3) | M(1,3) | M(0,3) |
Fig. 4
| M(3,0) | M(2,0) | M(1,0) | F | M(0,0) |
|--------|--------|--------|---|--------|
| M(3,1) | M(2,1) | M(1,1) | F | M(0,1) |
| M(3,2) | M(2,2) | M(1,2) | F | M(0,2) |
| M(3,3) | M(2,3) | M(1,3) | F | M(0,3) |
Fig. 5

CYCLE 1

CYCLE 2

EUCLID DIVIDE

EUCLID DIVIDE (CONT.)

EUCLID DIVIDE (CONT.)

EUCLID MULTIPLY

CYCLE 1

CYCLE 2

EUCLID MULTIPLY (CONT.)

CELL 0

CYCLE 1

CELL 0

CYCLE 2

EUCLID MULTIPLY (CONT.)

HIGH-SPEED REAL-TIME REED-SOLOMON DECODER

FIELD OF THE INVENTION

This invention relates to the field of error correction in data. More particularly, this invention relates to system architecture for a high-speed real-time Reed-Solomon decoder used to correct errors in stored or transmitted data.

BACKGROUND OF THE INVENTION

Computers and other electronic equipment are useful for communicating, transmitting and storing information for retrieval at another location or later time. Unfortunately, extrinsic noise introduced by the electronic system or external system can cause error to occur in the transmitted or stored information.

Reed-Solomon (RS) codes are known and used for encoding and decoding information in such a way that induced errors are correctable. Such coding schemes are discussed in *Error-Correction Coding for Digital Communications* by George C. Clark, Jr. and J. Bibb Cain, published by the Plenum Press the contents of which are hereby incorporated by reference. The reader is directed to this book for additional information.

VLSI implementations of the decoder have been presented in the literature. K. Y. Liu in an article entitled "Architecture for VLSI Design of Reed-Solomon Decoders" IEEETC, Volume C-33, pages 178-179 (February 1984) discloses a system requiring 40 VLSI chips for the 100 support chips operated at 2.5 Mbits/second rate. A. M. Shao et al. in the article "A VLSI Design of a Pipeline Reed-Solomon Decoder" IEEETC, Volume C-34, pages 394-403 (May 1985) disclose an alternate implementation with no performance data given. Each of these designs utilize systolic arrays. The number of clock cycles required for error correction is dependent upon the number of errors. These implementations are thus not real-time decoders. A high-speed real-time Reed-Solomon decoder is needed for improved performance of error correction applications. The use of custom integrated circuits for such a Reed-Solomon decoder is desirable to reduce the number of integrated circuits necessary for the implementation.

SUMMARY OF THE INVENTION

A Galois Field error correction decoder is described which can correct an error in a received polynomial. The apparatus includes means for generating a plurality of syndrome polynomials. A magnitude polynomial, $\Omega(x)$, and a location polynomial, $\Lambda(x)$, having a first derivative, $\Lambda'(x)$, are calculated from the syndrome polynomials utilizing Euclid's Algorithm. The module utilizing Euclid's Algorithm includes a general Galois Field multiplier. The values of the magnitude polynomial $\Omega(x)$ is multiplied by a power of x and is divided by the first derivative of the location polynomial evaluated at various rulers of x to form a quotient. Preferably the division includes finding the inverse of the first derivative and multiplying the inverse by the value of the magnitude polynomial multiplied by a power of x. The error is corrected by Exclusive ORing the quotient with the received polynomial.

BRIEF DESCRIPTION OF THE DRAWINGS

FIG. 2 is a block diagram of a prior art syndrome generator.

FIG. 4 is a block diagram of a general Galois Field multiplier for 4 bit multiplicands.

FIG. 5 is block diagram for a $GF(2^4)$ general Galois Field multiplier implementing the polynomial $p(x)=x^4+x+1$.

FIG. 7 is a block diagram of the constant multiplier utilized in the syndrome generator of the preferred embodiment.

DETAILED DESCRIPTION OF THE PREFERRED EMBODIMENT

Figure 1:
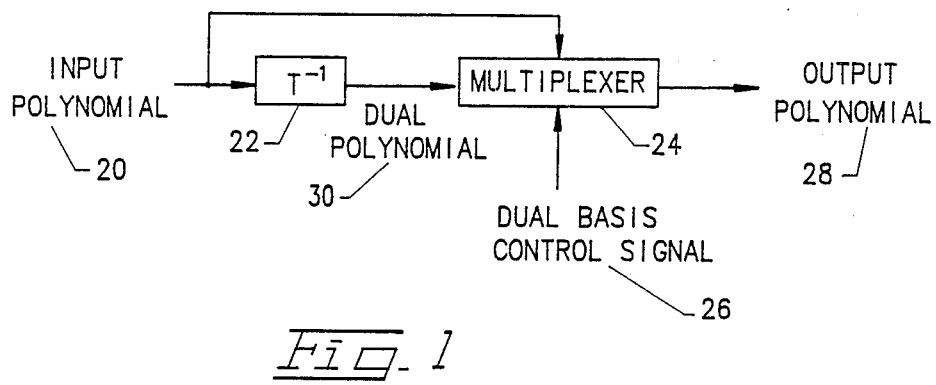
FIG. 1 is a block diagram of a circuit which forms the dual basis of a Galois Field polynomial.

The RS code used can be described with the following parameters and notation:

q: the number of bits in each symbol
$n \leq 2^q - 1$: the number of symbols in each code block
t: the number or correctable symbol errors
2t: the number of check symbols
$K = n - 2t$: the number of information symbols
C(x): the code block represented as an order $n-1$ polynomial
M(x): the K information symbols represented as an order $K-1$ polynomial
G(x): the order $n-K-1$ generator polynomial

Code Description

Each RS code is an (n,k) code where k<n. This means that each code contains n total symbols but only k symbols of information. The remaining n−k symbols contain the coded information necessary to correct errors and are sometimes called parity symbols.

The RS code block is defined to be $$C(x) = x^{2t} \cdot M(x) + M(x) \bmod G(x). \tag{1}$$

Another way of stating Eq. 1 is simply that every valid code block is divisible by the Galois Field generator polynomial G(x). In its simplest form, the generator polynomial is defined as $$G(x) = \prod_{i=0}^{2t-1} (x - \alpha^i) = \sum_{j=0}^{2t} G_j x^j \tag{2}$$
$$= (x - \alpha^0)(x - \alpha^1)(x - \alpha_2) \ldots (x - \alpha^{2t-i})$$

where $\alpha$ is a primitive element of the field. G(x) has zero roots at $\alpha^0, \alpha^1, \alpha^2, \ldots, \alpha^{2t-i}$.

A more general form of the generator polynomial is described as $$G(x) = \prod_{i=s}^{s+2t-1} (x - \beta^i) = \sum_{j=0}^{2t} G_j x^j \tag{3}$$

where s is an offset and $\beta$ is another primitive element of the field equal to $\alpha^i$. Use of the offset s allows for the development of a more general purpose RS decoder. The second form is the form used by NASA and ESA; specifically $\beta = \alpha^{11}$ and s=112. Symmetrical coefficients of G(x) are a consequence of an offset of 112.

Each of the symbols of the RS code polynomial are members of the finite Galois Field. A Galois Field can be defined by an irreducible polynomial p(x). This polynomial has coefficients from the field GF(p) and is irreducible. The infinite set of all polynomials can be mapped into the finite field by the congruency $$a(x) \equiv b(x) \bmod p(x).$$

Practically this means that the remainder of the division b(x)/p(x) is the field element a(x). The field element can be represented by the coefficients of a(x). If p is 2, then these coefficients are bits and the field elements in $GF(2^q)$ are q-bit binary words.

For example, consider a $GF(2^4)$ Galois Field where $p(x) = x^4 + x + 1$ and the primitive element $\alpha = x$. Addition in Galois Field arithmetic is the bit wise Exclusive OR. Thus, + and − are interchangeable so that $x^4 + x + 1 = 0$ or $x^4 = x + 1$. The members of this finite Galois Field represented by successive powers of the primitive element are:

TABLE 1

| | $\alpha^3$ | $\alpha^2$ | $\alpha^1$ | $\alpha^0$ | | $\alpha^3$ | $\alpha^2$ | $\alpha^1$ | $\alpha^0$ |
|---|---|---|---|---|---|---|---|---|---|
| $\alpha^0$ | 0 | 0 | 0 | 1 | $\alpha^8$ | 0 | 1 | 0 | 1 |
| $\alpha^1$ | 0 | 0 | 1 | 0 | $\alpha^9$ | 1 | 0 | 1 | 0 |
| $\alpha^2$ | 0 | 1 | 0 | 0 | $\alpha^{10}$ | 0 | 1 | 1 | 1 |
| $\alpha^3$ | 1 | 0 | 0 | 0 | $\alpha^{11}$ | 1 | 1 | 1 | 0 |
| $\alpha^4$ | 0 | 0 | 1 | 1 | $\alpha^{12}$ | 1 | 1 | 1 | 1 |
| $\alpha^5$ | 0 | 1 | 1 | 0 | $\alpha^{13}$ | 1 | 1 | 0 | 1 |
| $\alpha^6$ | 1 | 1 | 0 | 0 | $\alpha^{14}$ | 1 | 0 | 0 | 1 |
| $\alpha^7$ | 1 | 0 | 1 | 1 | | | | | |

Clark and Cain describe the formation of these Galois Fields.

Each Galois Field resulting from a different polynomial and/or a different primitive element has a different element sequence and may have a different number of elements.

Moreover, it is possible to allow the code to be described in a dual basis as discussed by M. Perlman and J. Lee in their article "Reed-Solomon Encoders: Conventional vs. Berlekamp Architectures", JPL Publication 71-82, December 1982 or by Robert J. McEliece in "Finite Fields for Computer Scientists and Engineers", Kluwer Academic Publishers, 1987. A dual basis is actually just another representation of the original field. If v is a q bit symbol in the original representation of the field, it can be represented by the vector v' in the dual basis. The relationship between v and v' is $v' = Tv$ and $v = T^{-1} v'$ where T is a linear operator in the field. Any operator L in the original representation of the field can be used in the normal representation with the transformation $L' = TLT^{-1}$. A single chip implementation of the encoder that produces RS block codes in the dual basis has been implemented. The decoder described here operates in either the dual basis or regular representation.

A block diagram of a circuit for forming a dual polynomial is shown in FIG. 1. An input polynomial 20 is coupled to a constant multiplier 22 and to a multiplexer 24. The constant multiplier multiplies the input polynomial 20 by the linear operator $T^{-1}$. The output of the constant multiplier is also coupled to a separate input of the multiplexer 24. The dual basis control signal 26 determines whether the output polynomial 28 is the input polynomial 20 or the dual polynomial that is formed by the constant multiplier 22.

During transmission the code suffers changes due to noise in the channel which amounts to an error polynomial being added to the code polynomial C(x). Let the received polynomial be $$R(x) = C(x) + E(x) = r_{N-1} x^{n-1} + \ldots r_1 x + r_0$$

where E(x) is the error polynomial and each $r_i$ is a field element. The first step in the decoding algorithm is to calculate the syndromes. R(x) is evaluated at each of the zeros of G(x), i.e., at $\beta^s, \beta^{s+1}, \beta^{s+2} \ldots, \beta^{s+2t-1}$. Because the code word, C(x) is a multiple of G(x) the zeros of G(x) are also zeros of C(x). For each of the 2t roots of G(x), the Code Polynomial C(x) is zero. Thus, the syndromes are $r(\alpha^0) = e(\alpha^1) \ldots, r(\alpha^{2T-1}) = e(\alpha^{2T-1})$. The 2t syndromes are $$S_k = \sum_{i=0}^{n-1} r_i \beta^{i(k+s)} \tag{4}$$

where $0 \leq k \leq 2t - 1$. The value of the syndrome polynomial can be defined as $$S(x) = \sum_{k=0}^{2t-1} S_k x^k \tag{5}$$

Another equivalent definition of the syndrome polynomial is as follows. The syndrome polynomial is defined as $$S(x) = R(x) \bmod G(x)$$

and is a measure of how far (how different) the received code word is from the one that was transmitted.

The next step is to obtain the error location polynomial, $\Lambda(x)$ and the error magnitude polynomial $\Omega(x)$. These polynomials have the following relationship with the syndrome polynomial $$S(x)\Lambda(x) = \Omega(x) \bmod x^{2t} \tag{6}$$

The error location and error magnitude polynomials can be obtained by using Euclid's greatest common divisor algorithm, which is a recursive operation. The algorithm is described later.

Once the two polynomials are known, the location and magnitude of a given error is found as follows. Let $\beta^i$ be a zero of $\Lambda(x)$ (i.e., $\Lambda(\beta^i) = 0$). The location of the error is in symbol n−i of the received polynomial R(x). The magnitude of the error is $$\Omega(\beta^i)/\Lambda'(\beta^i) \cdot (\beta^{111i}) \tag{7}$$

where $\Lambda'(x)$ is the first derivative of $\Lambda(x)$ with respect to x. For more details and examples, the reader is referred to Clark and Cain.

Architecture

The architecture and cell design are two factors contributing to efficient use of silicon area. Cell interconnect is an important issue in efficient chip design. Interconnect can consume major portions of a chip layout and greatly limit the amount of circuitry that can be placed on a chip. An objective in the design here was to minimize the amount of cell interconnect.

The VLSI cells used throughout the decoder include the following Galois Field processing elements: adder, constant multiplier, general multiplier, and field inverse. The constant multiplier performs the operation c·x, where c is a constant and x is a variable; the general multiplier performs the operation x1·x2 on the Galois Field element variables x1 and x2.

Addition in the Galois Field is the bitwise Exclusive OR of the field elements. Multiplication in the Galois Field is the result of the addition of the exponents of the $\alpha^i$ elements in the field. For example, referring to Table 1, if it is desired to multiply $\alpha^6 \cdot \alpha^7$ the result is $\alpha^{13}$. In binary representation 1100·1011=1101. $\alpha^6$ is the Galois Field element representing the polynomial $\alpha^3+\alpha^2$, $\alpha^7$ is $\alpha^3+\alpha+1$ and $\alpha^{13}$ is $\alpha^3+\alpha^2+1$ in the field defined in Table 1.

Another way of considering the multiplication operation is to multiply the polynomial representations of the variables. The multiplication and addition operations are commutative.

$$
\begin{array}{rl}
\alpha^7 = 1011 & \alpha^3 + \alpha + 1 \\
\alpha^6 = 1100 & \alpha^3 + \alpha^2 \\
\hline
& \alpha^5 + \alpha^3 + \alpha^2 \\
& \alpha^6 + \alpha^4 + \alpha^3 \\
\hline
& \alpha^6 + \alpha^5 + \alpha^4 + \alpha^3 + \alpha^3 + \alpha^2
\end{array}
$$

$$
\begin{array}{rl}
\alpha^6 &= 1100 \\
\alpha^5 &= 0110 \\
\alpha^4 &= 0011 \\
\alpha^3 &= 1000 \\
\alpha^3 &= 1000 \\
\alpha^2 &= 0100 \\
\hline
\overline{1101} &= \alpha^{13}
\end{array}
$$

These additions are the bitwise Exclusive OR of the elements.

A third way to consider this example is presented. The field elements a and b can be represented by the respective polynomials $$a(x)=a_{q-1}x^{q-1}+a_{q-2}x^{q-2}+\ldots+a_1x^1+a_0x^0$$

and $$b(x)=b_{q-1}x^{q-1}+b_{q-2}x^{q-2}+\ldots+b_1x^1+b_0x^0$$

The multiplication of two field elements is accomplished as follows:

$$
\begin{aligned}
a(x)b(x) = & \; a(x)b_0 + \\
& a(x)b_1x^1 \bmod p(x) + \\
& a(x)b_2x^2 \bmod p(x) \\
& \;\vdots \\
& \;\vdots + \\
& a(x)b_1x^{q-2} \bmod p(x) + \\
& a(x)b_1x^{q-1} \bmod p(x)
\end{aligned}
$$

As an example, in the field defined by $p(x)=x^4+x+1$ multiplicands $\alpha^6$ and $\alpha^7$.

$$\alpha^6 = 1100 = x^3 + x^2$$

$$\alpha^7 = 1011 = x^3 + x + 1$$

$$(x^3 + x^2)(x^3 + x + 1) = x^3 + x^2 \bmod p(x) = x^3 + x^2 +$$

$$x^4 + x^3 \bmod p(x) = x^3 + x + 1 +$$

$$x^6 + x^5 \bmod p(x) = \frac{x^3 + x}{x^3 + x^2 + 1} = \alpha^{13}$$

Therefore, $\alpha^6\alpha^7 = \alpha^{13}$.

These multiplications are performed in modulo arithmetic. There are only 15 elements in the Galois Field being considered. If the multiplication yields a result of order greater than $\alpha^{14}$ then 15 is subtracted from the exponent until the result is one of the elements of the elements. For example, $\alpha^{10}\cdot\alpha^{14}=\alpha^{(24-15)}=\alpha^9$. Using the alternate method $$
\begin{array}{rl}
\alpha^{10} = 0111 & \alpha^2 + \alpha + 1 \\
\alpha^{14} = 1001 & \alpha^3 + 1 \\
\hline
& \alpha^2 + \alpha + 1 \\
& \alpha^5 + \alpha^4 + \alpha^3 \\
\hline
& \alpha^5 + \alpha^4 + \alpha^3 + \alpha^2 + \alpha + 1
\end{array}
$$

$$
\begin{array}{rl}
\alpha^5 &= 0110 \\
\alpha^4 &= 0011 \\
\alpha^3 &= 1000 \\
\alpha^2 &= 0100 \\
\alpha^1 &= 0010 \\
\alpha^0 &= 0001 \\
\hline
\overline{1010} &= \alpha^9
\end{array}
$$

An alternate way to consider the example above is shown below.

$$
\begin{array}{rl}
\alpha^{10} = 0111 & \alpha^2 + \alpha + 1 \\
\alpha^{14} = 1001 & \alpha^3 + 1 \\
\hline
& \alpha^2 + \alpha + 1 \\
& \alpha^5 + \alpha^4 + \alpha^3 \\
\hline
& \alpha^5 + \alpha^4 + \alpha^3 + \alpha^2 + \alpha + 1
\end{array}
$$

$$\alpha^5 = 0110$$
$$\alpha^4 = 0011$$
$$\alpha^3 = 1000$$
$$\alpha^2 = 0100$$
$$\alpha^1 = 0010$$
$$\alpha^0 = 0001$$
$$\overline{1010} = \alpha^9$$

It has been shown by Riggle et al. in U.S. Pat. No. 4,413,339 that multiplication by a constant in Galois Fields can be performed by an array of exclusive-or gates. FIG. 2 depicts the general structure used here to implement a constant multiplier. An input message symbol 42 is coupled into a Galois Field adder 43. The adder 43 is coupled to supply information to register 44. Register 44 is coupled to supply information to multiplier 45. The multiplier 45 is coupled to add information back into the adder 43. Once the cycle is complete, information stored in the register 44 is supplied to the output terminal 46. In this way, the input message, symbol 42, is recursively added and multiplied, to achieve a proper output polynomial such as $output = x_0 + x_1\alpha + x_2\alpha^2 + \ldots$ The general multiplier is a more complex module and was implemented with a pass transistor logic circuit that performs multiplication of two Galois Field polynomials. There are a variety of general Galois Field multipliers described in the literature. The method used to perform the inverse operation is to program a ROM with the necessary values to look up the reciprocal of a given field element. Division is performed by looking up the inverse and multiplying by the inverse.

FIG. 4 shows a general Galois Field multiplier in $GF(2^4)$. The individual multiply cells are formed into an array of $4 \times 4$ multiply cells. The cells are shown to be numbered $M(x,y)$ where $x$ represents the column and $y$ represents the row. In order to implement a particular Galois Field element set, the feedback cells are included into the array of multiply cells as shown in FIG. 5. The feedback cells are labeled F. The $\beta^3$ column feeds into the $\beta^0$ column. The feedback cell feeds back into the $\beta^1$ column. The multiplier array indicated in FIG. 5 implements the polynomial $p(x) = x^4 + x + 1$. This is the same Galois Field whose elements are shown in Table 1.

Figure 6:
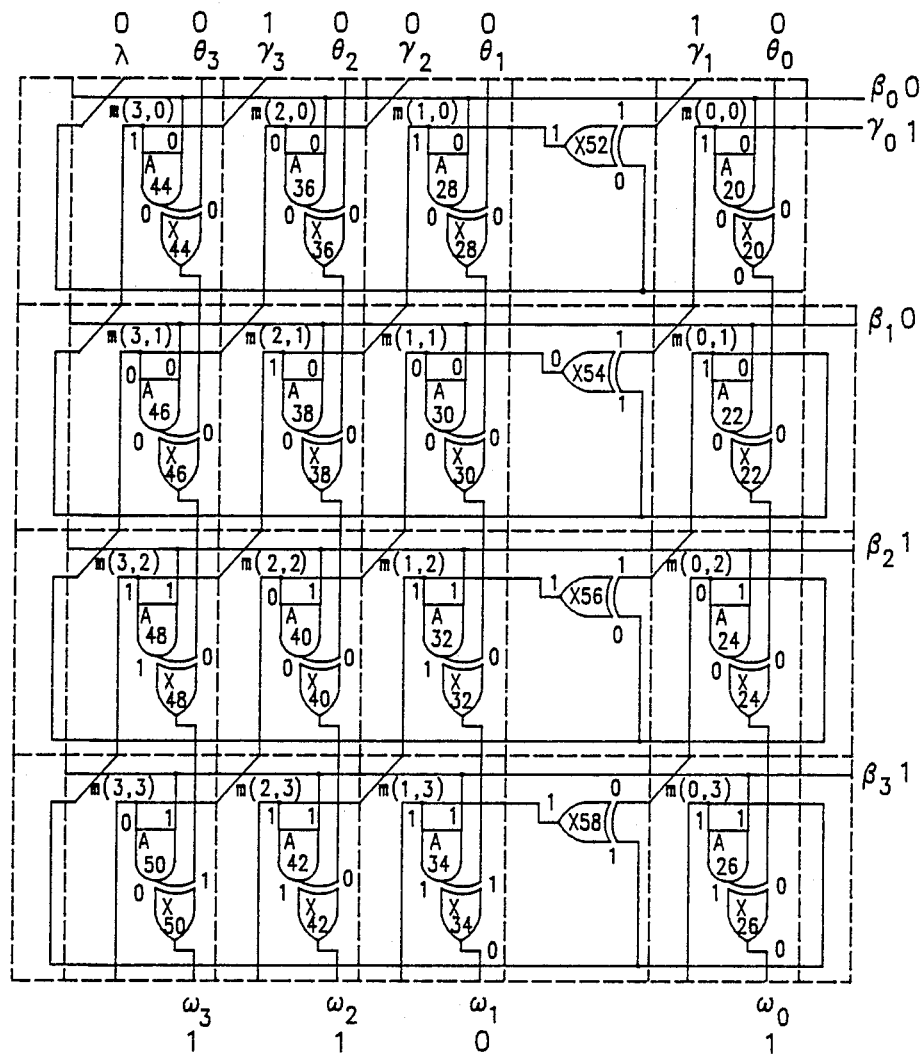
FIG. 6 is a more detailed block diagram of the circuit of FIG. 5.

FIG. 6 shows a more detailed block diagram of the circuit of FIG. 5. The multiplication is performed as follows. The $4 \times 4$ array of multiplier cells are numbered $M(x,y)$ where $x$ indicates column and $y$ indicates row similar to FIGS. 4 and 5. The binary inputs for $\beta$ and $\gamma$ are applied to the indicated inputs on the circuit schematic as FIG. 6. The inputs for $\Theta_0$ through $\Theta_3$ would allow the Galois Field addition of a third element to the product of $\beta$ times $\gamma$, i.e., $\Theta + \alpha\gamma$. The input $\delta$ is a carry in which would allow two or more similar blocks of $GS(2^4)$ general multipliers to be ganged together. Ordinarily for multiplication, the $\delta$s and $\Theta$s are set to binary 0 input. Thus, for a circuit which is intended to perform only multiplication operations the $\delta$ input can be deleted rather than setting the input to 0 to achieve the same result.

Figure 6A:
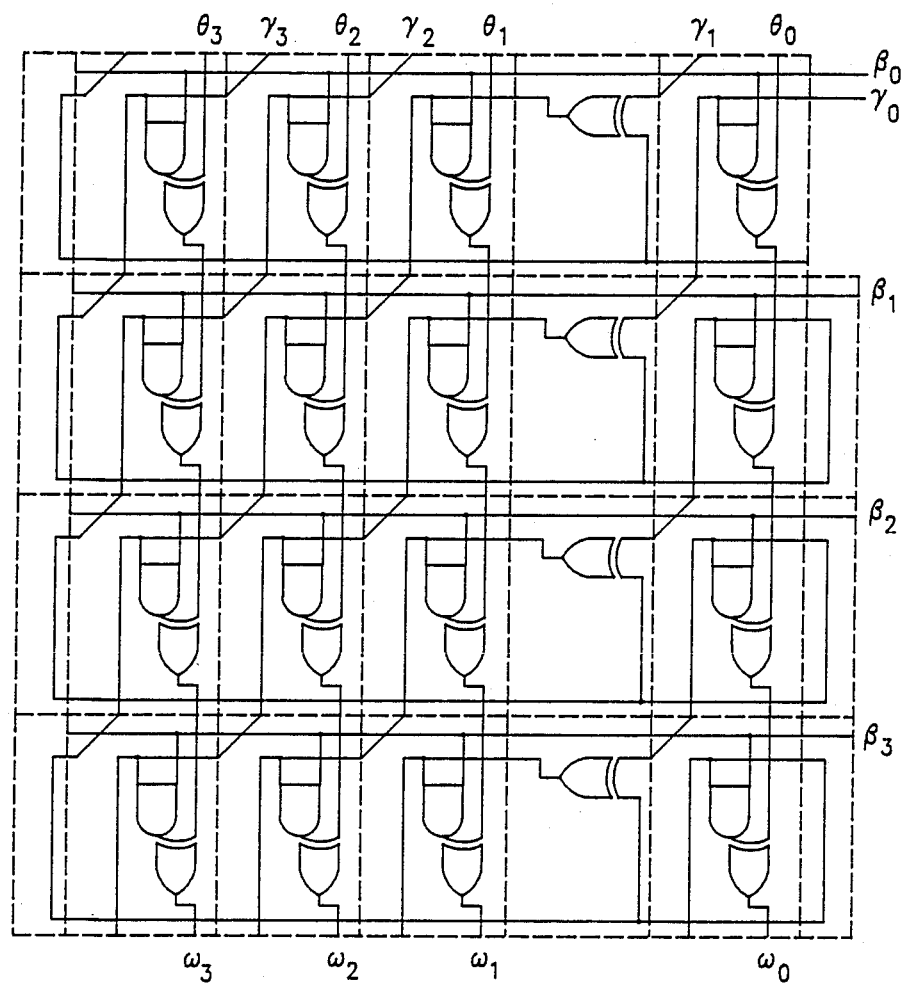
FIGS. 6a, 6b, and 6c which show alternate representations of the block diagrams of FIGS. 4, 5 and 6, respectively.

The multiplier of FIG. 6 can be generalized as shown in FIG. 6a and described as an efficient combinational circuit that can be described algorithmically. The multiplier performs the function $$w(x) = \gamma(x) * \beta(x) + \Theta(x)$$

where $\gamma(x)$ and $\beta(x)$ are the q bit multiplicands, $\Theta(x)$ is the q bit addend, $w(x)$ is the q bit result, and q is the number of bits in the field.

The concept behind the multiplier is that the partial products $$x^i\beta_j \mod p(x)$$

are formed for each of the q coefficients of $\beta(x)$ and accumulated along with $\Theta(x)$ to form the output $w(x)$. The general multiplier consists of q rows, with all of the rows being identical except for the zeroth one. The zeroth row performs the functions $$\gamma^{(1)}(x) = \gamma(x)$$

and $$\Theta^{(1)}(x) = \Theta(x) + \beta_0\gamma(x)$$

Figure 6B:
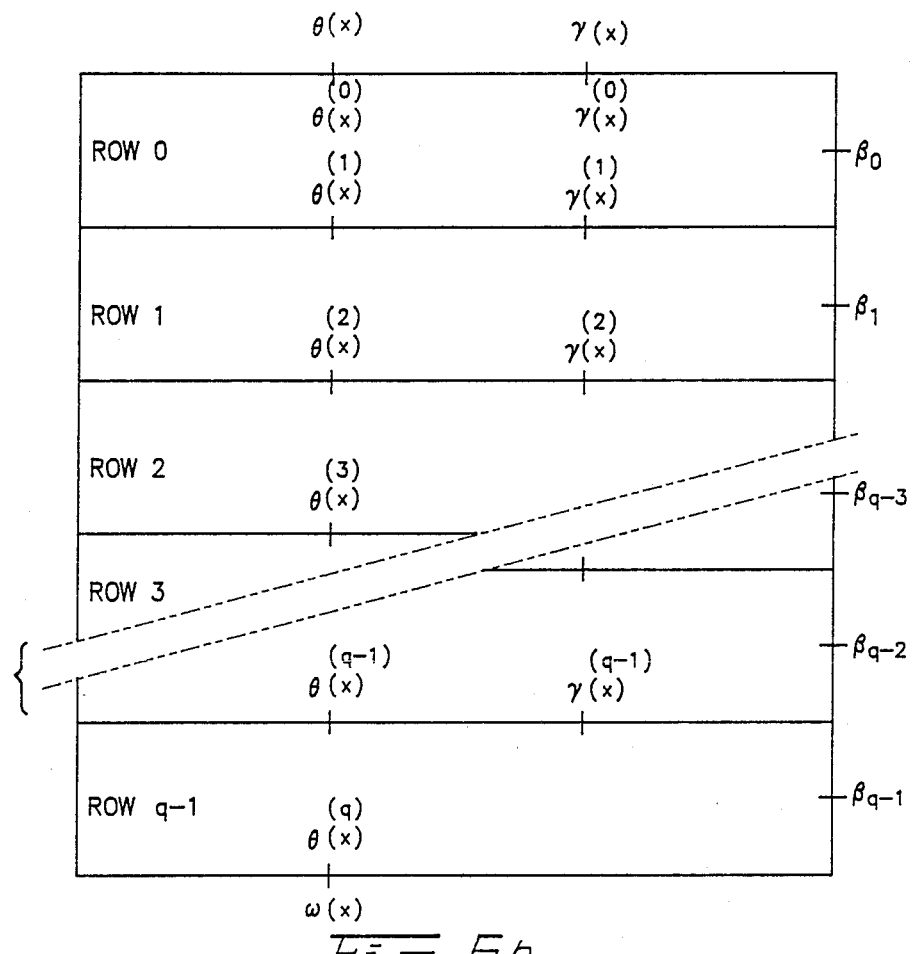

As shown in FIG. 6b, the zeroth row has the multiplicand input $\gamma(x)$ as the $\gamma^{(0)}$ input, and the addend input $\Theta(x)$ as the $\Theta^{(0)}$ input. The zeroth coefficient of $\beta(x)$ is the single bit input.

The function of the ith row, where i ranges from 1 to $q-1$, is $$\gamma^{(i+1)}(x) = x\gamma^{(i)}(x) \mod p(x)$$

and $$\Theta^{(i+1)}(x) = x\Theta^{(i)}(x) + [\beta_i\gamma^{(i+1)}(x)] \mod p(x)$$

Each row has 2 q-bit inputs, $\gamma^{(i)}(x)$ and $\Theta^{(i)}(x)$; 2 q-bit outputs, $\gamma^{(i+1)}(x)$ and $\Theta^{(i+1)}(x)$; and 1 single bit input, $\beta_i x^i$. Each of the signals with identical names between adjacent rows are connected together. The $\Theta^{(q)}$ output of the last row, row $q-1$, is the function result $w(x)$.

Each of the rows performs the two functions $$\gamma^{(i+1)}(x) = x\gamma^{(i)}(x) \mod p(x)$$

and $$\Theta^{(i+1)}(x) = \Theta^{(i)}(x) + \beta_i\gamma^{(i+1)}(x)$$

Figure 6C:
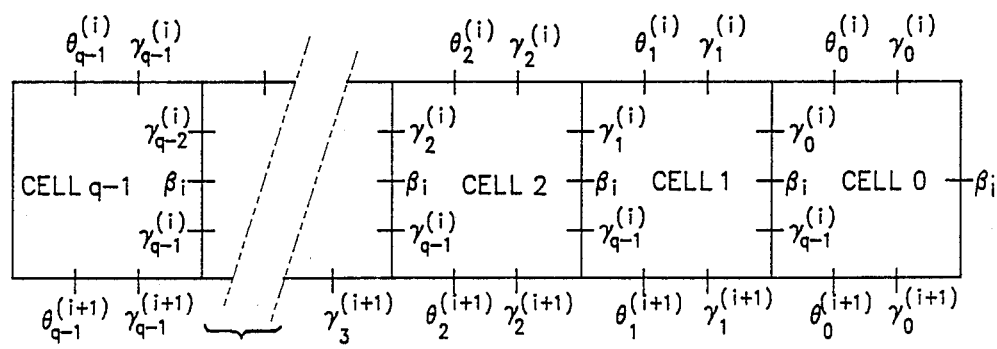
Figure 8A:
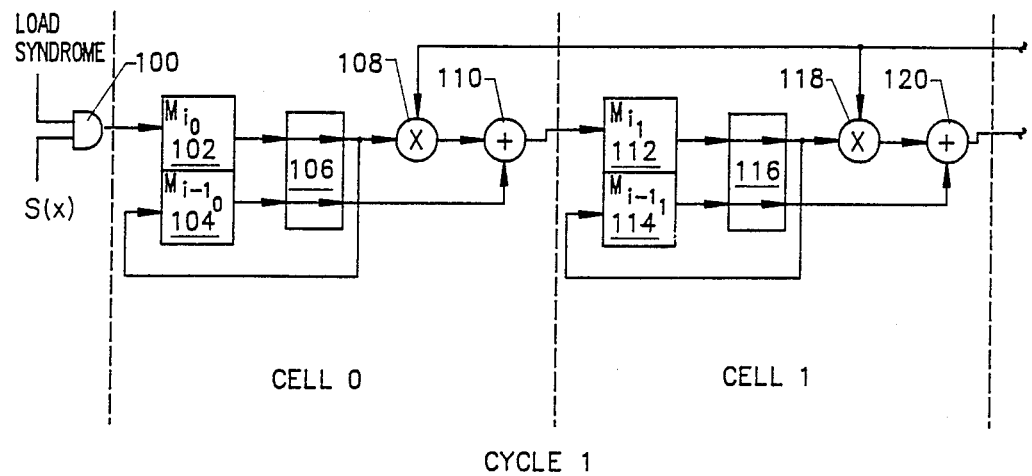
FIG. 8 is a block diagram of the Euclid Divide module.
Figure 8A:
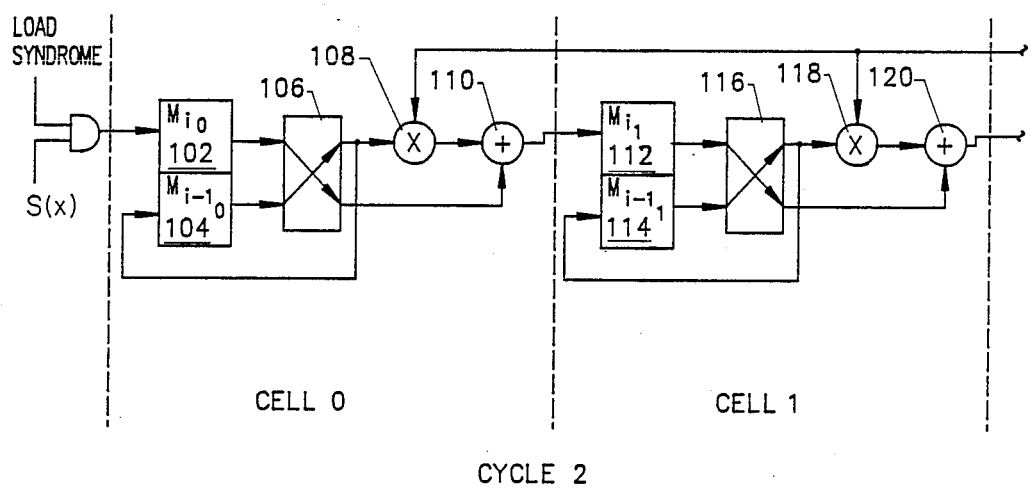
Figure 8B:
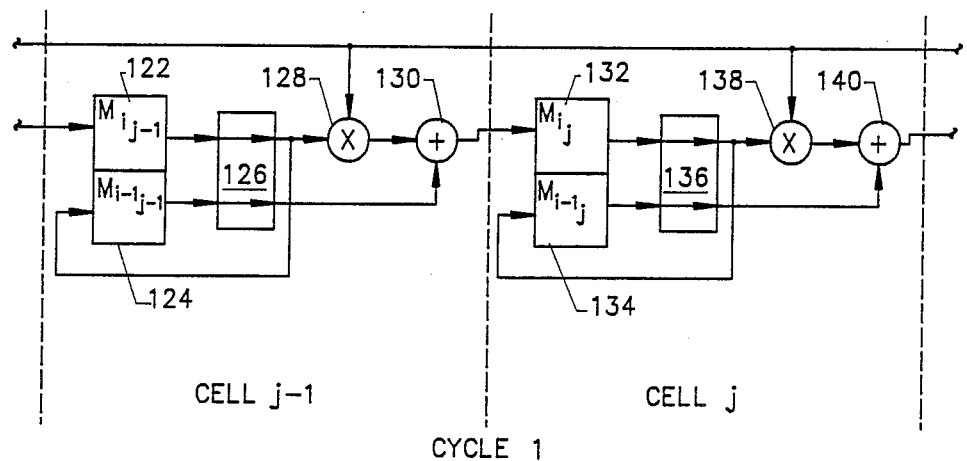
Figure 8B:
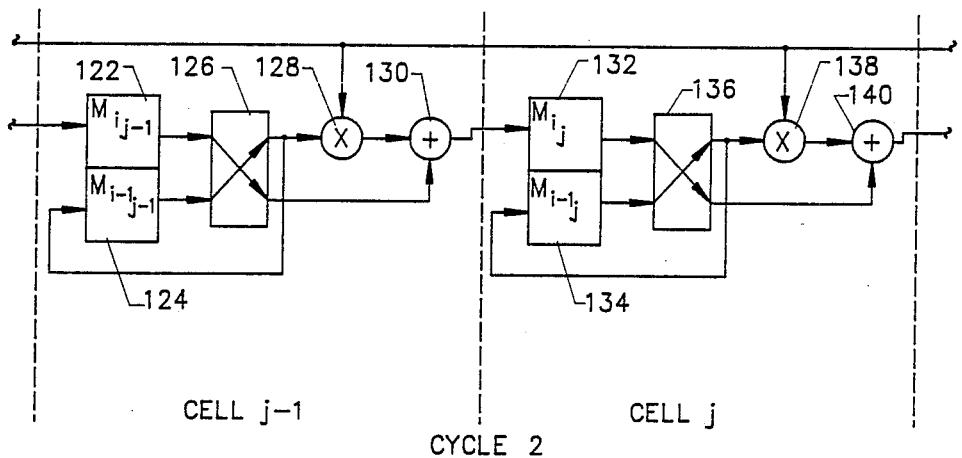
Figure 8C:
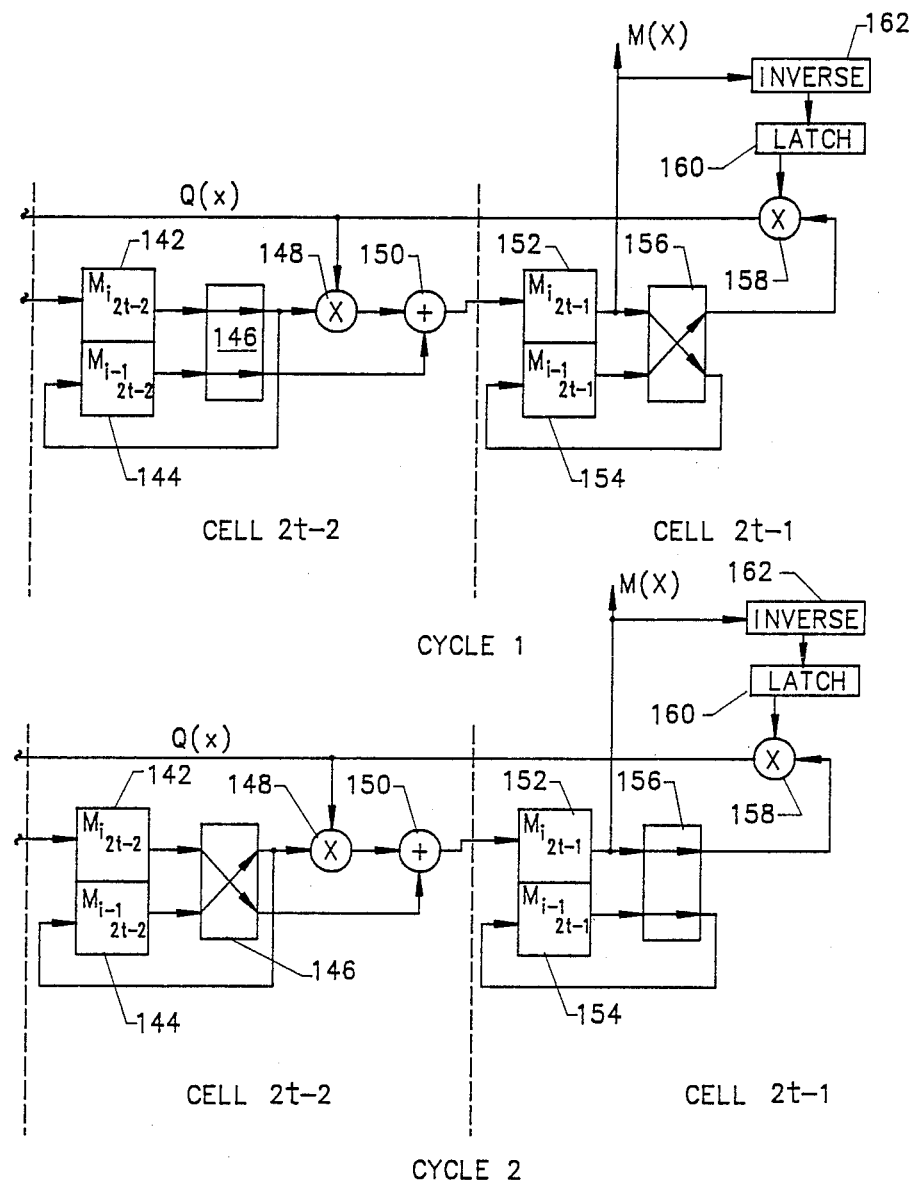
Figure 9A:
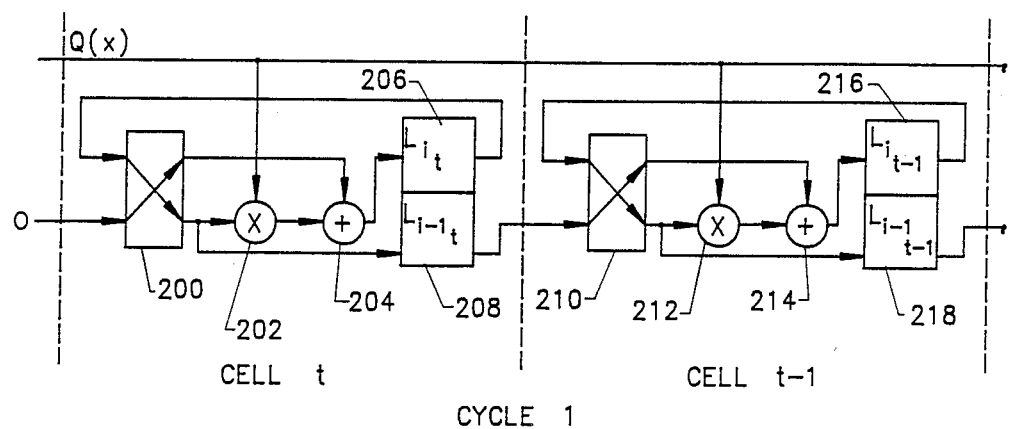
FIG. 9 is a block diagram of Euclid Multiple module.
Figure 9A:
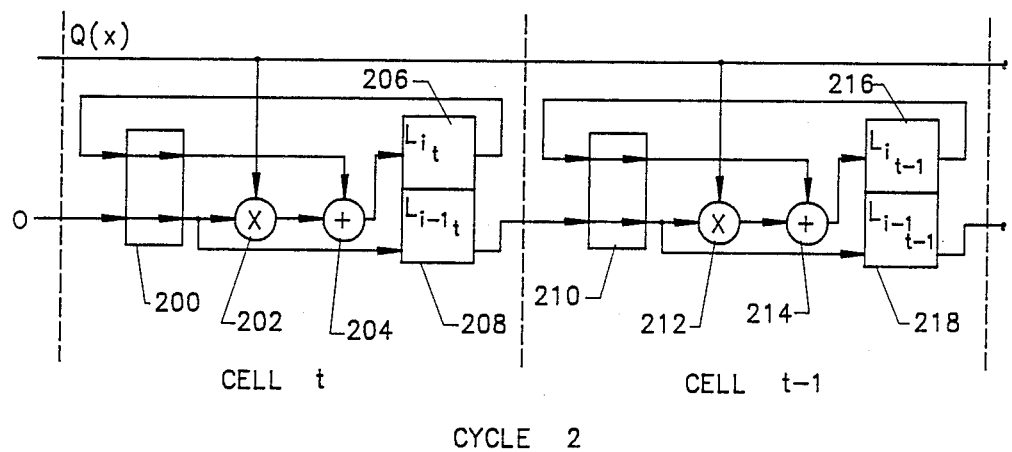
Figure 9B:
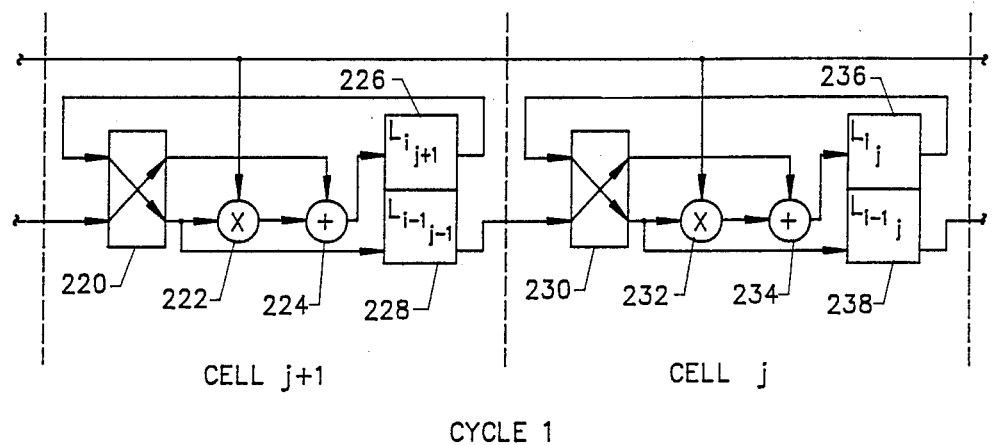
Figure 9B:
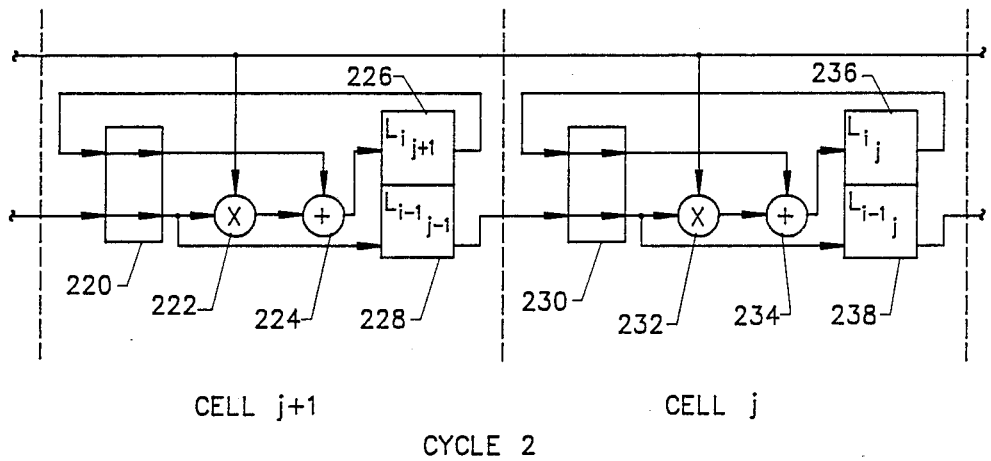
Figure 9C:
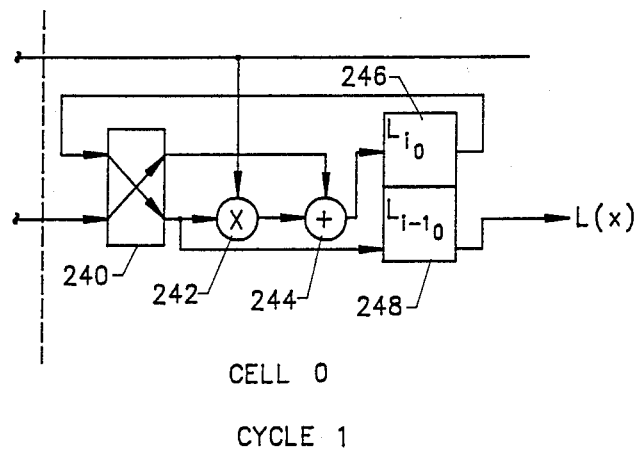
Figure 9C:
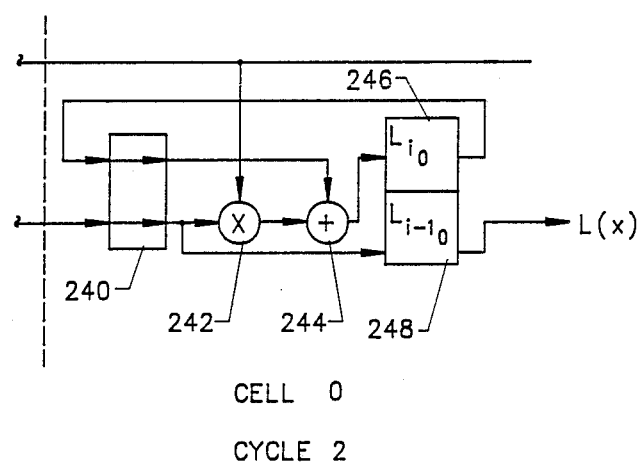
Figure 10:
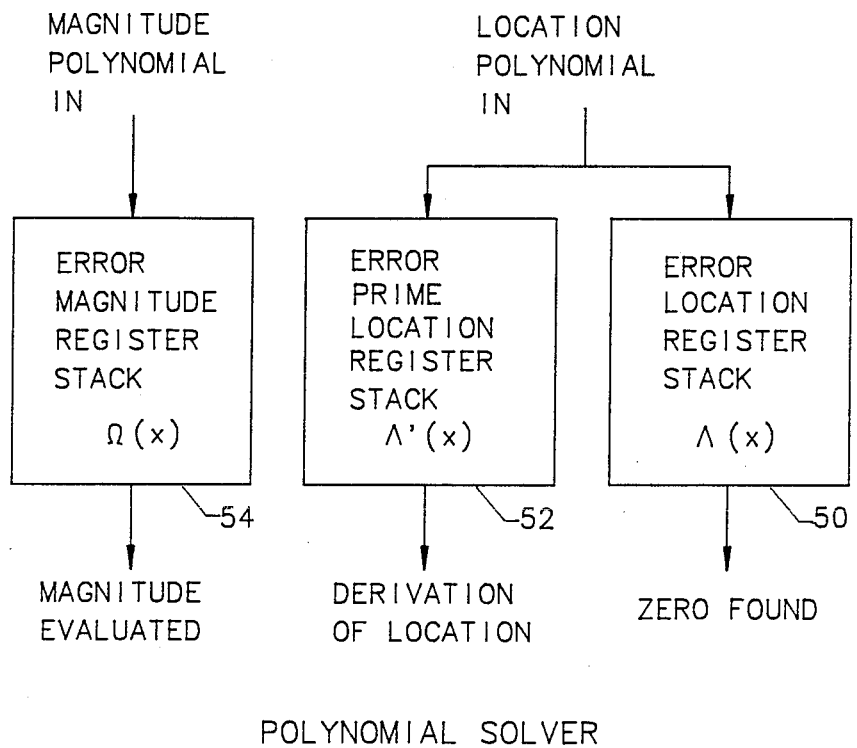
FIG. 10 is a block diagram of the polynomial solver.

The connections between the rows are shown in FIG. 6b. A detail of the row is shown in FIG. 6c. As shown in the figure, each row is made up of q cells.

The jth cell in the ith row has as inputs from the cell above $\Theta_j^{(i)}$, and $\gamma_j^{(i)}$. The jth cell in the ith row has as outputs to the cell below $\Theta_j^{(i+1)}$, and $\gamma_j^{(i+1)}$. The zeroth cell has a row input $\beta_i$ which is passed on to all of the cells in the row, and the last cell has as a row output $\gamma_q^{(i+1)}$ which is fed back to all of the cells in the row. The additional interconnect between each of the cells in the row is $\gamma_j^{(i+1)}$ which is passed from the jth cell to the next higher cell.

Each cell performs the two functions $$\Theta_j^{(i+1)} = \gamma_{j-1}^i + \gamma_{q-1}^i * p_j$$

and $$\Theta_j^{(i+1)} = \Theta_j^{(i)} + \beta_i\gamma_j^{(i+1)}$$

where $p_j$ is the jth coefficient of the polynomial p(x). The term $\gamma_q^{(i+1)} * p_j$ is created by an additional Exclusive OR gate inserted between cell j and cell j+1. There is an Exclusive OR gate added for each non-zero coefficient of the primitive polynomial p(x). If the coefficient is zero then the $\gamma_j^{(i+1)}$ is just equal to $\gamma_{j-1}^i$.

Each cell consists of a two input AND gate and a two input Exclusive OR gate. The AND gate performs multiplication in GF(x) and the Exclusive OR gate performs addition in GF(2). In cell j, the AND gate performs the multiplication $\beta_i\gamma_j^{(i+1)}$. The Exclusive OR gate adds this result to $\Theta_j^{(i)}$ which is the new $\Theta_j^{(i+1)}$.

For example, consider multiplying $\alpha^6 \cdot \alpha^7$ in the Galois Field polynomial $P(x)=x^4+x+1$ using the preferred embodiment of the general multiplier shown in FIG. 6a. Let the $\beta$ input be set to $\alpha^6$. As described above, $\alpha^6$ is represented by 1100. The $\beta_0$ input is set to 0, $\beta_1$ to 0, $\beta^2$ to 1, and $\beta^3$ to 1. Similarly, for $\alpha^7$, $\gamma_0$ is set to 1, $\gamma_1$ is set to 1, $\gamma_2$ is set to 0 and $\gamma^3$ is set to 1. In order to generate the outputs $\omega_0$, $\beta^0$ and $\gamma_0$ are ANDed together in AND gate A20. The output of AND gate A20, 0, and $\beta_0$, 0, are exclusive XORed together in Exclusive OR gate X20. Zero XOR zero is zero. The binary states, 0 or 1, of the various gates are indicated on the drawing of FIG. 5 for the remainder of the devices. $\beta^1$ and $\gamma_3$ are ANDed together in AND gate A22. The output zero of A22 is XORed together with the output of multiply cell M(0,0) in XOR gate X22. $\beta_2$ and $\gamma_2$ are ANDed together in AND gate A24. The output of AND gate A24, is XORed with the output of multiply cell M(0,1). $\beta_3$ and the output of XOR gate X52 are ANDed together in AND gate A26. The output of the Exclusive OR gate X52 is the result of the carry Exclusive ORed with $\gamma_1$. The carry input $\delta$ is set to 0. The output of A26 Exclusive ORed with the output of multiply cell M(0,2) is result $\omega^0$. $\omega^0$ equals 1.

The output $\omega_1$ is derived as follows. $\beta^0$ in multiply cell M(1,0) is ANDed together with the output of Exclusive OR gate X52 in AND gate 28. The output of AND gate A28 is Exclusive ORed with $\Theta_1$ in XOR gate X28. The output of Exclusive OR gate 54 is ANDed together with input $\beta^1$. Gate X54 XORs $\gamma_0$ AND $\gamma_3$. The output of AND gate A30 is Exclusive ORed in gate X30 with the output of multiplier cell M(1,0). The output of the multiplier cell M(1,0) is the output of the Exclusive OR gate X28. The output of the Exclusive OR gate X56 is ANDed with $\beta^2$ in AND gate A32. The inputs to the Exclusive OR gate X52 are $\gamma_3$ and $\gamma_2$. The output of gate A32 is Exclusive ORed with the output of cell M(1,1). $\beta^3$ and the output of gate X58 are ANDed together in AND gate A34. The output of AND gate A34 is Exclusive ORed with the output of multiplier cell M(1,2) in Exclusive OR gate X34 to form the output bit $\omega^1$. $\omega_1$ is a 0. Following a similar procedure for the columns resulting in output bit $\omega^2$ and output bit $\omega_3$, the entire polynomial resulting from the multiplication can be determined.

General Galois Field multiplier circuits are constructed of combinational logic. No clock pulses are required to toggle the data through the circuitry. In this way, the general Galois Field multiplier is faster than prior art designs. By constructing the general Galois Field multiplier of a cell construction, an extremely dense and compact circuit can be formed on an integrated circuitship utilizing this technology.

System Architecture

Figure 3:
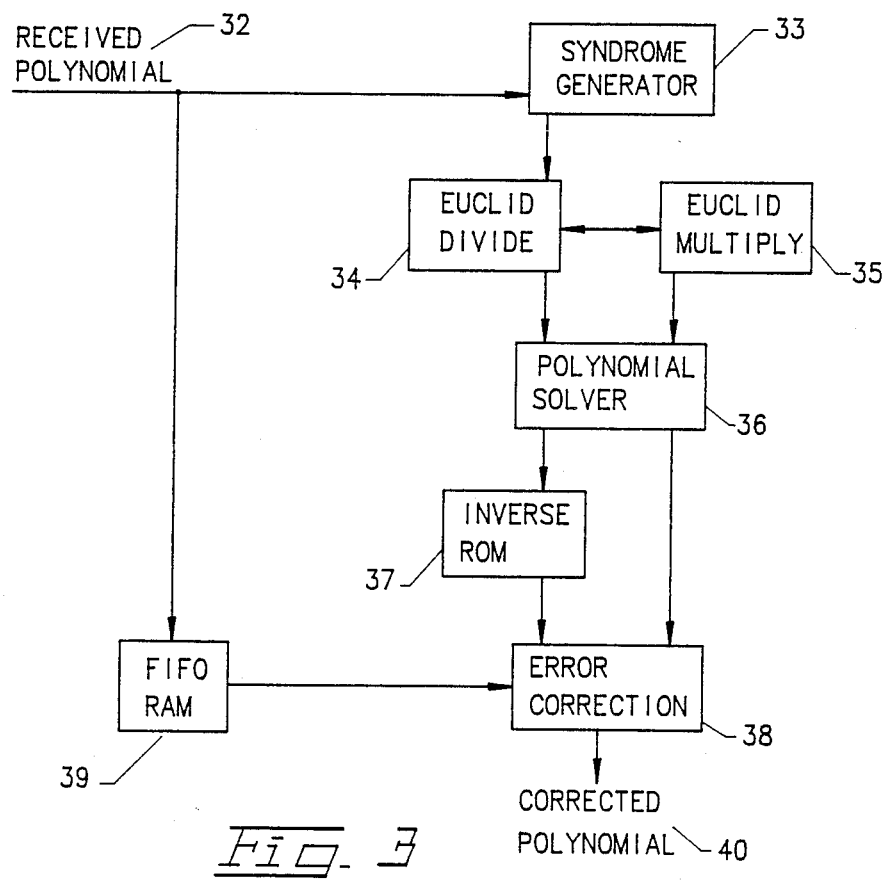
FIG. 3 is a block diagram of the general architecture of the error correction decoder of the preferred embodiment.

A block diagram of the decoder is shown in FIG. 3. The system is configured to perform in a pipelined manner where several messages are being processed simultaneously as depicted next:
  Message i: Syndrome Generator
  Message i−1: Euclid Multiply and Euclid Divide
  Message i−2: Polynomial Solver and Correction
  Message i−3: Data Output from Correction Module
In this way, once the pipeline has been filed, the messages are decoded as fast as a new message is received. The latency of this system is 4.

An overview of the architecture for the Galois Field error correction decoder is shown in FIG. 3. The received polynomial 32 is coupled to the syndrome generator 33. The syndrome generator 33 calculates each of the 2t syndromes for the given received polynomial 32. The syndrome generator 33 is coupled to the Euclid divide module 34. The Euclid divide module is coupled to the Euclid multiply module 35. The syndromes are input into the Euclid divide module 34. The Euclid divide module 34 generates the magnitude polynomial. A quotient developed by the Euclid divide module 34 is utilized by the Euclid multiply module 35 to develop the location polynomial.

The Euclid divide module 34 and Euclid multiply module 35 are coupled to the polynomial solver 36. The magnitude polynomial and the location polynomial are input to the polynomial solver. The polynomial solver calculates the first derivative of the location polynomial. The polynomial solver 36 also finds the zeros of the location polynomial. The polynomial solver 36 is coupled to the inverse ROM 37 and to the error correction module 38. The inverse ROM 37 is programmed with the inverse, i.e., 1/x, for the elements of the particular Galois Field. The inverse ROM is used to find the inverse of the first derivative of the location polynomial. The polynomial solver 36 also supplies the magnitude polynomial and the location of the zeros of the location polynomial.

The received polynomial 32 is also coupled to a FIFO RAM 39. The FIFO RAM 39 is sufficiently large to hold four received polynomials. The received polynomial is passed from the FIFO RAM 39 into the error correction unit 38 to be corrected by the magnitude and location information contained in the magnitude polynomial, location polynomial and the inverse of the first derivative of the location polynomial. Once the received polynomial 32 has been corrected, the corrected polynomial 40 is output from the error correction decoder for use in another circuit.

This error correction decoder operates in a four deep pipeline. The error correction module 38 can be acting upon a first message. The polynomial solver 36 can be acting upon a second message. The Euclid divide module 34 and the Euclid multiply module 35 operate upon a third message. The syndrome generator 33 can operate upon a fourth message. The FIFO RAM 39 stores the same four polynomials being acted upon as just described.

The general operation can be described as follows: the received polynomial, R(x), is input to both the FIFO for storage and to the syndrome calculator. The syndromes are passed to the Euclid Divide/Multiply module which generates $\Omega(x)$ and $\Lambda(x)$. These polynomials are passed to Polynomial Solver. Polynomial Solver evaluates $\Omega(x)$, $\Lambda(x)$, and $\Lambda'(x)$ at $x=\beta^i$ where i takes on the values $\{n, n-1, \ldots, (n-N)\}$ where $n-N$ is the amount that the code has been shortened. If $\beta^i$ is a root of $\Lambda(x)$, then a signal Zero-Found is passed to the Error Correction Module. Both $\Lambda'(x)$ and $\Omega(x)$ are evaluated for $x=\beta^i$ and these results are also presented to the Error Correction Module. The Error Correction Module determines the error magnitudes: if Zero Found is true of $x=\beta^i$, then the magnitude for location$=i \mod(2^{q-1})$ is given by Eq. 6; otherwise there is no error at that location. Since the Polynomial Solver calculates both $\Omega(x)$ and $\Lambda'(x)$, Error Correction only has to divide these two values. Finally the error magnitudes are exclusive-ored with the original information symbols and output.

Real time decoding is achieved. The system clock being the symbol clock is a very important feature. Therefore, this decoder can decode symbols at the same time message symbols are presented. Decoders that cannot use the symbol clock as the system clock must utilize a more complex clock system where the decoder operates at a higher clock rate than the symbol clock. Therefore, for a given technology, this decoder can operate faster than other designs which require a system clock that operates at a higher rate than the symbol clock. Moreover, operating at a symbol clock rate reduces the amount of message buffering.

Syndrome Generator

The calculation of the syndromes is given in Eq. 1. The calculation $r_i \beta^{i(k+s)}$ is evaluated for all $r_i$ and each $k$ in $(0, 1, 2, \ldots 2t-1)$ and $i$ in $(0, 1, 2, \ldots, n-1)$ (the number of input symbols in the message). There are $2t$ syndromes, one for each of the $2t$ check symbols. The multiplier is a constant multiplier with the constant $\beta^{k+s}$. A well known logic circuit for calculating syndrome Sk is shown in FIG. 6. Each of the $\beta^{k+s}$ is a zero of the generator polynomial $G(x)$ of equation (2) or (3). For example, if the generator polynomial of equation (2), $$G(x) = \prod_{i=0}^{2t-1} (x - \alpha^i),$$

were used to develop the code word $C(x)$, the syndromes are calculated from the zero of that equation. $G(x)=(x-\alpha^0)(x-\alpha^1)(x-\alpha^2)\ldots(x-\alpha^{2t-1})$ so that the zeros are $\alpha^0, \alpha^1, \alpha^2, \ldots \alpha^{2t-1}$. From equation (4) $R(x)=C(x)+E(x)$. Because $C(x)$ is a properly coded word each of the $C(\alpha^i)$ terms are zero. Therefore $$R(\alpha^0) = C(\alpha^0) + E(\alpha^0) = E(\alpha^0)$$
$$R(\alpha^1) = C(\alpha^1) + E(\alpha^1) = E(\alpha^1)$$
$$\vdots$$
$$R(\alpha^{2t-1}) = C(\alpha^{2t-1}) + E(\alpha^{2t-1}) = E(\alpha^{2t-1})$$

The received polynomial $R(x)=Cx+E(x)$ may also be shown as $$R(x)=R_0x^0+R_1x^1+R_2x^2+\ldots+R_{n-1}x^{n-1}$$

As described above, each of the syndromes is the received polynomial evaluated at the zeros of the generator polynomial. The syndrome polynomials may be represented as:

$$S_0 = R_0 + \alpha R_1 + \alpha^2 R_2 + \alpha^3 R_3 + \ldots + \alpha^{n-1} R_{n-1}$$
$$S_1 = R_0 + \alpha^2 R_1 + \alpha^4 R_2 + \alpha^6 R_3 + \ldots + \alpha^{2(n-1)} R_{n-1}$$
$$\vdots$$
$$S_{2t-1} = R_0 + \alpha^{2t-1} R_1 + \alpha^{2(2t-1)} R_2 + \alpha^{3(2t-1)} R_3 + \ldots + \alpha^{(2t-1)(n-1)} R_{n-1}$$

If there were only four terms in each syndrome equation
$$S_0=R_0+R_1\alpha^1+R_2\alpha^2+R_3\alpha^3$$
$$S_1=R_0+R_1\alpha^2+R_2\alpha^4+R_3\alpha^6$$
can be written as
$$S_0=R_0+(R_1+((R_2+R_3\alpha)\alpha))\alpha$$
$$S_1=R_0+(R_1+((R_2+R_3\alpha^2)\alpha^2))\alpha^2$$

Each of the $n$ terms is multiplied by the appropriate constant representing a zero of the generator polynomial. With $n$ input $R_i$ symbols, a total of $n$ clock pulses are needed to calculated a syndrome. All $2t$ syndromes are calculated simultaneously with $2t$ circuits operating in parallel.

Since one of the design constraints placed on the syndrome generator is that the system clock be equal to the symbol clock, it is necessary to calculate $2t$ syndromes in $n$ clock pulses. A common means to configure $2t$ circuits as shown in FIG. 2 is to first calculate $2t$ syndromes and then shift the syndromes out. However, this would require $n+2t$ clock pulses to calculate and shift out the syndromes, which is unacceptable.

FIG. 7 shows an improved circuit for use in generating syndromes. An input message symbol 42 is coupled into a Galois Field adder 43. The adder 43 is coupled to supply information to register 44. Register 44 is coupled to supply information to multiplier 45. The multiplier 45 is coupled to add information back into the adder 43. For an $(n,k)$ code the first $n-1$ symbols are input to be recursively added and multiplied. As depicted in FIG. 7 these results reside in the register 44. After $n-1$ symbols are input, the last symbol is present at the input. The last clock pulse adds the last input symbol with the output of the multiplier 45 in the adder 43 and couples the result into the register 47. With the system clock being the symbol clock, if the contents of Syndrome are transferred to the shift register after $n$ clock pulses ($n$ input symbols), the contents of the shift register can be shifted out while the next set of syndromes are being calculated.

Some applications require that the decoder be capable of decoding dual basis RS code words. It is necessary to transform the dual basis code words into regular field code words; this is accomplished by operating on each received word by T' as defined above and can be implemented with an array of XOR and ZERO cells as described above and shown in FIG. 1. An extra feature is added to the syndrome generator to operate in the regular field, the dual basis or any other basis. An input signal DUAL is provided such that if DUAL is 1, then each input symbol is multiplied by T' (translation into regular field); if DUAL=0, then the input symbols are not affected.

Euclid Divide/Multiply

The Euclid divide/multiply module decomposes the $2t$ Syndrome polynomials into the error location polynomial $\Lambda(x)$ and the error magnitude polynomial $\Omega(x)$. The relationship between the three polynomials is given in Eq. 8. The algorithm used to get $\Omega(x)$ and $\Lambda(x)$ is the recursive application of the following 2 equations:

$$\Omega^i(x) = \Omega_{i-2}(x) \bmod \Omega_{i-1}(x) \qquad (10)$$

$$\Lambda_i(x) = -q_i(x)\Lambda_{i-1}(x) + \alpha_{i-2}(x) \qquad (11)$$

where $q_1(x)$ are the non-negative powers of the division $\Omega_{1-2}(x)$ divided by $\Omega_{i-1}(x)$. The initial conditions of the algorithm are: $\Omega_{i-1}(x) = x_{2t}$, $\Lambda_{-1}(x) = 0$, $\Omega_0(x) = S(x)$, $\Lambda_0(x) = 1$. The algorithm continues until the order of $\Omega_i(x)$ is less than t.

The circuitry for Eq. 10, the Euclid Divide module, consists of a linear array of 2t computational cells and a special cell to calculate the quotients. Each computational cell consists of a general multiplier/adder, two 8 wide registers, and two 8 wide 2 to 1 multiplexers.

The circuitry for Eq. 11, the Euclid Multiply module, consists of a linear array of t+1 processors. Each processor consists of a general multiplier/adder, two 8 wide registers, and two 8 wide 2 to 1 multiplexers. This is the same circuitry used to implement the Euclid Divide Circuit. It is, however, connected differently.

The Euclid Divide/Multiply engines may be implemented in a VLSI integrated circuit, with the Euclid divide engine roughly twice as big as the Euclid Multiply engine. Even though there are approximately 70,000 transistors in the device it may be implemented in a relatively small area. The extraordinary density is achievable because: (1) the general multiplier can be drawn exceedingly dense when domino logic design methodologies are employed, and (2) the given architecture is highly regular and requires virtually no interconnect. These two characteristics make it ideal for VLSI implementation.

The architecture of the hardware used to implement Euclid's algorithm is shown in FIGS. 8 and 9. FIG. 8 shows the Euclid divide hardware module and FIG. 9 shows the Euclid multiply module. Each of the modules is designed to operate in one of two cycles.

The Euclid divide module is comprised of 2t cells, 0 through 2t−1. Each of the cells 0 through 2t−2 is identical. Referring to cell 0, a typical cell each cell has an $M_i$ register 102, an $M_{i-1}$ register 104, a multiplexer 106, a general Galois Field multiplier 108 and a Galois Field adder 110. Each of the registers $M_i$ and $M_{i-1}$ are eight bit registers. The $M_i$ register 102 is coupled to receive an input. The output of the $M_i$ register is coupled to a first input of the multiplexer 106. The multiplexer 106 has a first input, a second input, a first output and a second output. The multiplexer may be configured in one of two ways as shown in FIG. 8; cycle 1 and cycle 2. The first configuration of the multiplexer passes a signal through from the first input to the first output and similarly from the second input to the second output. The second configuration of the multiplexer passes a signal from the first input to the second output and from the second input to the first output as shown in FIG. 8 cycle 2 for cell zero. The first output of the multiplexer 106 is coupled to a first input of the general multiplier 108 and as an input to the register $M_{i-1}$ 104. The output of the multiplier 108 is coupled to the first input of the adder 110. The second output of the multiplexer 106 is coupled to a second input of the adder 110. The output of the adder 110 is coupled to the input of the $M_i$ register of the next cell 112. The multiplier 108 is also coupled to receive the quotient $Q(x)$ as a multiplicand on the second input.

In cell zero the $M_i$ register 102 is coupled to receive the output of AND gate 100. If a binary 1 is coupled to the load syndrome input of AND gate 100, the syndrome $S(x)$ is coupled into the $M_{i0}$ register 102. If the load syndrome input to AND gate 100 is set to 0 then a zero byte is coupled to the input of the $M_{i0}$ register 102.

In cell 2t−1 the output of the $M_i$ register is coupled to the M(x) bus and to the inverse ROM 162. The inverse ROM is coupled to latch 160. The output of latch 160 is coupled to a second input of the Galois Field multiplier 158. The first output of the multiplexer 156 is also coupled to a first input of the Galois Field multiplier 158. The second output of the multiplexer 156 is coupled as an input to the $M_{i-1}$ register 154.

By studying the block diagram for the Euclid divide hardware in FIG. 8 it can be seen that the difference between the hardware configuration in cycle 1 and cycle 2 is the configuration of the multiplexers. In cycle 1 the multiplexers for cell zero through cell 2t−2 is configured as a straight pass through. In other words the first input is coupled to the first output and the second input is coupled to the second output. For cell 2t−1 in the first cycle the multiplexer 156 is configured to criss-cross the signal. Thus, the first input of multiplexer 156 is coupled to the second output of multiplexer 156 and the second input is coupled to the first output. In cycle 2 each of the multiplexers is in the alternate state. Thus, cells zero through 2t−2 are coupled to criss-cross the signal and cell 2t−1 is coupled pass the signals straight through the multiplexer.

The Euclid divide circuit is initialized by resetting all the $M_{i-1}$ registers to zero except for cell 2t−1. $M_{i-1 2t-1}$ is set to 00000001. The quotient bus is forced to zero. Each of the multiplexers for cell 0 though cell 2t−2 are in the data criss-cross mode. The multiplexer in cell 2t−1 is in the straight pass through mode. The load syndrome input to AND gate 100 is set to 1. In this configuration the syndrome $S(x)$ is shifted into each of the $M_i$ registers so the byte 2t of the syndrome is in register $M_{i2t-1}$, the byte j+1 of the syndrome is in register $M_{ij}$ and the first byte of the syndrome is in register $M_{i0}$.

Considering cell 0, the first byte of the syndrome is transferred to $M_{i0}$ by AND gate 100. Because the initialization sequence requires the multiplexer 106 to criss-cross the data the first byte of the syndrome enters the first input of multiplexer 106, exits the second output of multiplexer 106 and is coupled to the adder 110 as an addend. The output of the $M_{i-10}$ register, which is zero, is criss-crossed through multiplexer 106 and is multiplied with a quotient bus of zero, which is also zero and added to the contents of the $M_{i0}$ register in adder 110. The output of the adder is transferred to the $M_{i1}$ register 112 in cell 1. In this way the contents of register $M_{i0}$ are simply transferred to register $M_{i1}$. This procedure is repeated 2t times in order to load the 2t bytes of the syndrome into the 2t $M_i$ registers.

After the Euclid divide module is initialized and the syndrome is loaded the division occurs. If register $M_{i2t-1}$ equals zero the contents of the $M_i$ registers are shifted using the setup of cycle 2 until the contents of register $M_{i2t-1}$ is non-zero.

A cycle 2 is the same procedure to shift in the syndrome $S(x)$ described above. An additional register, which is not shown, counts the number of times the syndrome must be shifted before $M_{i2t-1}$ is a non-zero byte. This can be done for example by incrementing a register. Once the contents of register $M_{i2t-1}$ is non-zero then the core cycle is performed. After the core cycle the contents of the $M_i$ registers are shifted the same number of cycle 2 times as before the core cycle.

The core cycle consists of a cycle 1 followed by a cycle 2. When cycle 1 is performed $M_{i2t-1}$ contains the most significant byte of the $\Omega_{i-1}$ polynomial. The contents of $M_{i2t-1}$ 152 is stored in $M_{i-12t-1}$ 154. It is also input to the inverse ROM 162 which looks up the inverse, i.e., $1/M_{i2t-1}$, passes that information through latch 160 and multiplies it by the contents of register $M_{i-12t-1}$ and supplies that information to the quotient bus. The information on the quotient bus Q(x) is multiplied by the information in each of the remaining $M_i$ cells for example $M_{ij-1}$ and added to $M_{i-1j-1}$ and stored as $M_{ij}$.

Register $M_{i0}$ is loaded with all zeros. Core cycle 2 latches the inverse of $M_{i2t-1}$ from cycle 1 in latch 160. Each $M_{i-1j-1}$ is multiplied by the quotient bus and the product is added to $M_{ij-1}$ and stored in $M_{ij}$. Cycle 2 is repeated for the number of pre-core cycle 2's. The value remaining in the last t bytes of the $M_i$ registers equals the polynomial $\Omega(x)$. This polynomial is shifted onto the M(x) line by performing cycles 2's. A new syndrome may be shifted in while shifting out $\Omega(x)$. The circuit is initialized as described above and the next $\Omega(x)$ polynomial is calculated. The highest order byte of the syndrome is shifted in first and the highest order byte of omega is shifted out first. By performing these steps the four Euclid divide equations:

$$\Omega_{-1}(x) = 2t \quad (1)$$

$$\Omega_0(x) = S(x) \quad (2)$$

$$\Omega_i(x) = \Omega_{(i-2)}(x) \bmod \Omega_{(i-1)}(x) \quad (3)$$

$$q_i(x) = \Omega_{(i-2)}(x) \text{ div } \Omega_{(i-1)}(x) \quad (4)$$

are performed.

The Euclid multiply algorithm is performed by the circuit shown in the block diagram of FIG. 9. Each of the t+1 cells, cells 0 through t are designed the same. For example cell t is comprised of a multiplexer 200, a Galois Field multiplier 202, a Galois Field adder 204, an $L_i$ register 206 and a $L_{i-1}$ register 208. Each of the registers $L_i$ and $L_{i-1}$ are 8 bit bytes. The multiplexer 200 is the same as the multiplexers in the Euclid divide circuit. In cell t the first input of the multiplexer 200 is coupled to receive the output of register $L_{it}$ 206. The second input of multiplexer 200 is coupled to receive a zero. The first output of the multiplexer 200 is coupled to a first input of the adder 204.

The second output of the multiplexer 200 is coupled to a first input of the multiplier 202 and to the input of register $L_{i-1t}$ 208. The second input of multiplier 202 is coupled to receive the quotient bus Q(x) generated by the Euclid divide circuit described above. The output of the multiplier 202 is coupled to a second input of the adder 204. The output of the adder 204 is coupled into the register $L_{it}$ 206. In each of the remaining cells, zero through t−1, the second input of the multiplexer is coupled to the output of the preceding register $L_{i-1j}$.

In cycle 1 each multiplexer is configured to criss-cross the first input to the second output and the second input to the first output. In cycle 2 all multiplexers are configured to pass the signal straight through from the first input to the first output and second input to the second output.

To initialize the circuit each of the registers $L_{i-1j}$ is set equal to zero by shifting in the zero applied to the second input of multiplexer 200 utilizing cycle 2s.

In cycle 1 the contents of $L_i$ are shifted to $L_{i-1}$. Referring to FIG. 9, cell j, the output of the $L_{ij}$ register 236 is coupled to the first input of the multiplexer 230. The multiplexer criss-crosses the data and so the information in the register $L_{ij}$ is supplied to the second output of the multiplexer 230. The multiplexer 230 is coupled to the input of the register $L_{i-1j}$ 238.

The information in register $L_{i-1j+1}$ 228 is coupled to the second input of the multiplexer 230. The information in the register $L_{ij}$ 236 is coupled through the multiplexer 230 to a first input of the multiplier 232. The information on the quotient bus Q(x) from the Euclid divide circuit is multiplied by the information in the register $L_{ij}$ and applied to a second input of the adder 234. This information is added to the information in $L_{i-1j+1}$ and stored in register $L_{ij}$ 236. The only exception is cell t where the input to register $L_{i-1t}$ equals zero. The control sequence for the Euclid multiply is the same as the control sequence for the Euclid divide with one exception. Once the stop control comes from the Euclid divide the contents of the $L_i$ registers are shifted into the $L_{i-1}$ registers. This is done with a cycle 1 because the $L_{i-1}$ registers can be easily shifted using cycle 2's and are thus used to pass the L(x) polynomial on for further processing.

Once the stop signal is received cell t contains the highest order of the L(x) polynomial. Any zero bytes are shifted out and discarded. Then the L(x) polynomial is shifted out, lowest order byte first. If the stop control comes on a cycle 1 there are no zeros to be shifted out otherwise if a stop control occurs on a cycle 2, which can only happen on a pre-core cycle 2, then the number of zeroes is the number of pre-core cycle 2's. A shift right control occurs with each post-core cycle in the Euclid divide algorithm. The circuit of FIG. 9 for the Euclid multiply module finds the error location polynomial by repeatedly applying the recursive equations:

$$\Delta_{-1}(x) = 0 \quad (1)$$

$$\Delta_0(x) = 1 \quad (2)$$

$$\Delta_i(x) = q_i * \Delta_{(i-1)}(x) + \Delta_{(i-2)}(x) \quad (3)$$

Polynomial Solver

Polynomial Solver evaluates three polynomials simultaneously: the error location polynomial $\Lambda(x)$, error magnitude polynomial $\Omega(x)$, and the first derivative of the error location polynomial $\Lambda'(x)$. The architecture of the Polynomial Solver consists of three registers stacks as shown in FIG. 11. One stack, the $\Lambda(x)$ stack 50, searches for the zeros of the error location polynomial. An adjacent register stack, the $\Lambda'(x)$ stack 52, evaluates the derivative of the error location polynomial. The $\Lambda'(x)$ register stack shares the same input bus as error location, $\Lambda(x)$, but only loads the odd coefficients of the location polynomial. The third register stack, the $\Omega(x)$ stack 54, receives the error magnitude polynomial from the Euclid module. The $\Omega(x)$ register stack 54 has a data path totally separate from the other two register stacks.

With n symbols in the received polynomial, there are n possible symbol errors. The zero's of the error location polynomial $\Lambda(x)$ specify the location of the symbol errors as defined in Eq. 6 and restated here: If $\beta^i$ is a zero of $\Lambda(x)$ (i.e., $\Lambda(\beta^i)=0$), then the location of the error is in location $-i \bmod(2^q-1)$, $i=0, 1, \ldots, n-1$. Finding the zero's of $\Lambda(x)$ involves a search of the elements of the field. If the number of zero's of $\Lambda(x)$ is equal to the degree of $\Lambda(x)$, then the message is said to be correctable, otherwise an uncorrectable error condition exists.

For a full code length where $n=255$, all 255 field elements must be searched. If $\Lambda(x)$ can be evaluated for each field element in one clock pulse, then a total of 255 clock pulses are required to search through the elements of the field. Moreover since the complete set of field elements are being examined, it does not matter which order the field elements are searched relative to execution speed.

For shortened codes and with the constraint that the system clock is equal to the symbol clock, searching through 255 elements cannot be permitted. However, for $n<255$, there are possible error message locations $n-1, n-2, \ldots, 1, 0$. To determine if an error occurred in one of the locations as above, only field elements $\beta^{255}, \beta^{254}, \ldots, \beta^{255-n+1}$ respectively must be evaluated in $\Lambda(x)$. Any zero of $\Lambda(x)$ for $x=\beta^i$, $i<255-n+1$, would correspond to a nonexistent message symbol. To evaluate $\Lambda(x)$ for only n field elements and hence require only n clock pulses, it is necessary to search the field in the order defined above, which is done in the Polynomial Solver module.

Since only n clock pulses are allowed to determine the zeros of $\Lambda(x)$, there must be a separate control section to input the $\Lambda(x)$ and $\Omega(x)$ coefficients from the Euclid module. As in the case of the Syndrome Generator, the Polynomial Solver has shift registers that accept $\Lambda(x)$ and $\Omega(x)$ asynchronously. In this mode. it is possible to receive the coefficients of $\Lambda(x)$ for one message while at the same time searching for the zero's of the previous message. When the field elements of one error location polynomial have been completely searched, the coefficients from the $\Lambda(x)$ previously loaded into the shift register can begin immediate evaluation and hence completing the required search in n clock pulses.

The error magnitude and first derivative of the error location polynomials are evaluated at the same time and for the same field elements as the error location polynomial. The correction module is interested in the evaluation of $\Omega(x)$ and $\Lambda'(x)$ only for lo those field elements where $\Lambda(x)=0$. Even though it is not necessary to evaluate $\Omega(x)$ and $\Lambda'(x)$ at every field element, it does no harm. However, from a speed of operation point of view, there is a great advantage in parallel evaluation of all polynomials for each field element. When $\Lambda(x)=0$, the value of $\Omega(x)$ and $\Lambda'(x)$ at the field element which forced $\Lambda(x)$ to 0 has already been calculated. The error correction module simply divides these two values as defined in Eq. 3.

Summary

A decoder has been presented that corrects up to 16 symbol errors for a Reed Solomon code at 80 Mbit/second data rate. The output consists of the corrected information symbols and a status word. The status word, which is inserted in symbol location 31 (location of the first check symbol), contains the number of errors found and an uncorrectable error flag. If the message is uncorrectable, the information symbols are unchanged. The operation rate of the decoder chip set as a whole exceeds 1.65 BOPS. Although the present invention has been shown and described with respect to preferred embodiments, various changes and modifications which are obvious to a person skilled in the art are deemed to lie within the spirit and scope of the invention.

What is claimed is:

1. A Galois Field decoder for correcting an error in a received message comprising:
   a. means for calculating a magnitude polynomial representing a portion of a magnitude of said error in said received message;
   b. means for calculating a location polynomial representing a location of said error in said received message, said location polynomial having a first derivative polynomial;
   c. means for calculating the first derivative polynomial of said location polynomial, said first derivative having a plurality of non-zero values, each of said non-zero values having an inverse;
   d. means for calculating said inverse values:
   e. means for multiplying each of said inverse values with a value of said magnitude polynomial for forming a correction polynomial; and
   f. means for correcting said received message by combining the received polynomial with the correction polynomial.

2. The Galois Field decoder according to claim 1 wherein said means for calculating said inverse values includes a ROM for storing values of inverses for elements in said Galois Field.

3. A digital logic Galois Field polynomial solver which performs an operation during a clock pulse for correcting a received polynomial field element R(x), in a Galois Field in an (n, k) error correction code, wherein n is a number representing the number of unique elements in a code and k is number representing a number of elements of information in the code, comprising;
   a. first means for evaluating $\Omega(x)$, wherein $\Omega(x)$ is a polynomial
   whereby $$\frac{x^{s-1} \cdot \Omega(x)}{\Lambda'(x)}$$

represents a magnitude of an error said first means coupled within the polynomial solver;
   b. second means for evaluating $\Lambda(x)$ where $\Lambda(x)$ is a polynomial representing a location of an error said second means coupled within the polynomial solver;
   c. third means for evaluating $\Lambda'(x)$, where $\Lambda'(x)$ is a polynomial representing a first derivative of $\Lambda(x)$; said third means coupled within the polynomial solver and
   d. fourth means for evaluating said polynomials for an arbitrary n in n clock pulses said fourth means coupled within the polynomial solver.

4. The Galois Field polynomial solver according to claim 3 wherein the improvement further comprises evaluating each polynomial for a highest order coefficient of an error polynomial first to a lowest order coefficient last.

5. A Galois Field syndrome generator of the type having a plurality of constant multipliers for generating a syndrome polynomial of 2t syndromes in n clock pulses, said generator having a register stack coupled to said multipliers for calculating said syndromes wherein the improvement comprises a shift register embodied coupled to said register stack and means for inhibiting said multipliers coupled to said multipliers.

6. A Galois Field syndrome generator according to claim 5 having a selectable basis convertor for generating a syndrome from an input that contains symbols in any basis.

7. The Galois Field syndrome generator according to claim 6 wherein the convertor is comprised of an array of Exclusive OR cells.

8. A Galois Field Euclid Algorithm apparatus for operating on an arbitrary received polynomial R(x), for calculating a magnitude polynomial, $\Omega_i(x)$ having a first plurality of coefficients and a location polynomial, $\Lambda_i(x)$, having a second plurality of coefficients, said magnitude polynomial representing a magnitude of an error in said received polynomial and said location polynomial representing a location of said error in said received polynomial for use with a code having t correctable errors, said apparatus comprising:
   a. a Euclid Algorithm divide module coupled to receive said received polynomial for implementing a first equation set forth below: $\Omega_i(x) = \Omega_{i-2}(x) \bmod \Omega_{i-1}(x)$; and
   b. a Euclid Algorithm multiply module coupled to receive said received polynomial for implementing a second equation set forth below: $\Lambda_i(x) = -q_i(x)\Lambda_{i-1}(x) + \Lambda_{i-2}(x)$.

9. The Galois Field Euclid Algorithm apparatus according to claim 8 wherein:
   a. said divide module comprises:
      (1) a quotient bus;
      (2) a plurality of first cells, each first cell having:
         (a) a first input and a first output;
         (b) a first register having a second input and a second output, said second input coupled to a said first input;
         (c) a second register having a third input and a third output;
         (d) a first 2 input/2 output multiplexer coupled to receive having a fourth input, a fifth input, a fourth output and a fifth output, said fourth input coupled to said second output, said fifth input coupled to said third output and said fourth output coupled said third input; and
         (e) a first Galois Field multiplier having a sixth input, a seventh input and a sixth output, said sixth input coupled to said fourth output and to said third input and said seventh input coupled to said quotient bus;
         (f) a Galois Field adder having an eighth input, a ninth input and a seventh output, said eighth input coupled to said sixth output, said ninth input coupled to said fifth output and said seventh output coupled to said first output; and
      (3) a second cell having:
         (a) a third register having a tenth input and an eighth output;
         (b) a fourth register having an eleventh input and a ninth output;
         (c) a second 2 input/2 output multiplexer having a twelfth input, a thirteenth input, a tenth output and an eleventh output said eighth output coupled to said twelfth input, said ninth output coupled to said thirteenth input and said eleventh output coupled to said eleventh input;
         (d) means for calculating an inverse value having a twenty-second input and an eighteenth output, said twenty-second input coupled to said eighth output;
         (e) a latch means having a twenty-third input and a nineteenth output, said twenty-third input coupled to said eighteenth output; and
         (f) a second Galois Field multiplier having a twenty-fourth input, a twenty-fifth input and a twentieth output, said twenty-fourth input coupled to said nineteenth output, said twenty-fifth input coupled to said tenth output and said twentieth output coupled to said quotient bus; and
   b. said multiply module comprises:
      (1) said quotient bus; and
      (2) a plurality of third cells, each said third cell having:
         (a) a first register having a fourteenth input and a twelfth output;
         (b) a second register having a fifteenth input and a thirteenth output;
         (c) a third 2 input/2 output multiplexer having a sixteenth input, a seventeenth input, a fourteenth output and a fifteenth output, said sixteenth input coupled to said twelfth output;
         (d) a Galois Field multiplier having an eighteenth input, a nineteenth input and a sixteenth output, said eighteenth input coupled to said fifteenth output and said ninteenth input coupled to said quotient bus; and
         (e) a Galois Field adder having a twentieth input, a twent-first input and a seventeenth output, said twentieth input coupled to said sixteenth output, said twenty-first input coupled to said fourteenth output and said seventeenth output coupled to said fourteenth input.

10. A Galois Field error correction decoder comprising:
   a. means for receiving a received polynomial;
   b. means for generating a plurality of syndrome polynomials, for said received polynomial;
   c. means for calculating a magnitude polynomial and a location polynomial having a first derivative from said syndrome polynomials utilizing Euclid's Algorithm, said means for calculating including a general Galois Field multiplier comprised of combinational logic circuits;
   d. means for dividing said magnitude polynomial by said first derivative of said location polynomial comprised of means for calculating an inverse of said first derivative and multiplying said inverse by said magnitude polynomial for forming a correction polynomial; and
   a. means for correcting an error in said received polynomial by combining the received polynomial with the correction polynomial.

11. A commutative general purpose multiplier in a $GF(2^n)$ Galois Field having a plurality of sets of elements, each element having a plurality of binary bits, with each set corresponding to a polynomial p(x) having one or more terms in said Galois Field, said multiplier for multiplying a first element by a second element comprising:
   a. an n×n array of multiplier cells arranged in n columns of multiplier cells, each column having n multiplier cells 0 through n−1, by n rows of multiplier cells, each row having n multiplier cells 0 through n−1, the column cells 0 through n−1 corresponding to the bits of a first element and the row cells 0 through n−1 corresponding to the bits of a second element such that each ith multiplier cell in each jth column is coupled to each (i+1)th multiplier cell in the jth column and to the (i+1)th multiplier cell in the (j+1)th column;

b. a plurality of input means, one of said input means coupled to each said multiplier cell; and c. a plurality of feedback means, one or more in each row corresponding to said terms of said polynomial p(x) coupled between each said ith cell in the jth column and the (i+1)th cell in the (j+1)th column where appropriate according to p(x), and means for receiving an input from one of said columns of said array and for providing a feedback signal to one or more multiplier cells, whereby a product of said multiplier is one element of said set of elements.

12. The multiplier according to claim 11 wherein said multiplier is asynchronous.

13. The multiplier according to claim 12 wherein said multiplier cells and said feedback means are comprised of combinational logic circuits.

* * * * *

UNITED STATES PATENT AND TRADEMARK OFFICE
CERTIFICATE OF CORRECTION

PATENT NO. : 4,873,688

DATED : October 10, 1989

INVENTOR(S) : Gary K. Maki, Kelly B. Cameron, Patrick A. Owsley

It is certified that error appears in the above - identified patent and that said Letters Patent is hereby corrected as shown below:

In Column 6, Line 15, insert --and-- before "multiplicands".

In Column 6, Lines 60-67 and Column 7, Lines 1-10, $$a^{10} = 0111 \quad a^2 + a + 1$$
$$a^{14} = 1001 \quad a^3 + 1$$

$$\begin{array}{r} a^2 + a + 1 \\ a^5 + a^4 + a^3 \\ \hline a^5 + a^4 + a^3 + a^2 + a + 1 \end{array}$$

$$a^5 = 0110$$
$$a^4 = 0011$$
$$a^3 = 1000$$
$$a^2 = 0100$$
$$a^1 = 0010$$
$$a^0 = 0001$$
$$\overline{1010} = a^9 \text{ "}$$

and replace with --

$$a^{10} = 0111 = x^2 + x + 1$$
$$a^{14} = 1001 = x^3 + 1$$
$$(x^2 + x + 1)(x^3 + 1) = x^2 + x + 1 \text{ modp}(x) = x^2 + x + 1$$
$$+ x^5 + x^4 + x^3 \text{ modp}(x) = x^3 + x^2 + 1$$
$$\overline{x^3 + x} = a^9 \text{ --}.$$

In Column 7, Line 24 after "multiplied" delete --,--.

In Column 7, Line 57, replace "αγ" with --βγ--.

In Column 8, Line 34, after "=" delete --x--.

In Column 8, Line 41, replace "function" with --functional--.

UNITED STATES PATENT AND TRADEMARK OFFICE
CERTIFICATE OF CORRECTION

Page 2 of 3

PATENT NO. : 4,873,688
DATED : October 10, 1989
INVENTOR(S) : Gary K. Maki, Kelly B. Cameron, Patrick A. Owsley It is certified that error appears in the above - identified patent and that said Letters Patent is hereby corrected as shown below:

In Column 8, Line 64, delete "$\theta_j^{(i+1)} = \gamma_{j-1}^i + \gamma_{q-1}^i * p_j$" and replace with $--\gamma_j^{(i+1)} = \gamma_{j-1}^i + \gamma_{q-1}^i * p_j--$.

In Column 9, Line 6, replace "$\gamma_{j-1}^i$" with $--\gamma_{j-1}^i--$.

In Column 9, Line 9, delete "(x)" and insert --(2)--.

In Column 9, Line 38 replace "$\omega^0 \cdot \omega^0$" with $--\omega_0 \cdot \omega_0--$.

In Column 9, Line 39, replace "$\beta^0$" with $--\beta_0--$.

In Column 9, Line 57 replace "$\omega 2$" with $--\omega 2--$.

In Column 11, Line 9, replace "$2^{q-1}$" with $--2q-1--$.

In Column 12, Line 25, replace "calculated" with --calculate--.

In Column 12, Line 67, "Euclid Divide/Multiply" should be centered and underlined as a heading.

In Column 13, Line 6, replace "$\Omega^i(x)$" with $--\Omega_i(x)--$.

In Column 13, Line 8, replace "$\alpha$" with $--\Lambda--$.

In Column 13, Line 12, replace "X2t" with $--X^2t--$.

In Column 16, Lines 45-49, replace each occurrence of "$\Delta$" with $--\Lambda--$.

In Column 17, Line 36, after mode delete "." and insert --,--.

In Column 17, Line 48, delete --lo--.

UNITED STATES PATENT AND TRADEMARK OFFICE
CERTIFICATE OF CORRECTION

PATENT NO. : 4,873,688
DATED : October 10, 1989
INVENTOR(S) : Gary K. Maki, Kelly B. Cameron, Patrick A. Owsley It is certified that error appears in the above - identified patent and that said Letters Patent is hereby corrected as shown below:

In Claim 3, Column 18, Line 37, after "is" insert --a--.

In Claim 3, Column 18, Line 49, after "Λ(x)" insert --,--.

In Claim 8, Column 19, Line 14, after "(x)" insert --,--.

In Claim 10, Column 20, Line 42, delete --,--.

Signed and Sealed this

Eighteenth Day of September, 1990

Attest:

HARRY F. MANBECK, JR.

*Attesting Officer*  *Commissioner of Patents and Trademarks*